(12) United States Patent
Chia

(10) Patent No.: US 7,002,498 B2
(45) Date of Patent: Feb. 21, 2006

(54) ANALOG DEMULTIPLEXING

(75) Inventor: Chor-Yin Chia, Santa Clara, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 11/102,962

(22) Filed: Apr. 11, 2005

(65) Prior Publication Data

US 2005/0190090 A1    Sep. 1, 2005

Related U.S. Application Data

(63) Continuation of application No. 10/236,340, filed on Sep. 5, 2002, now Pat. No. 6,897,800.

(60) Provisional application No. 60/317,482, filed on Sep. 5, 2001.

(51) Int. Cl.
*H03M 1/00* (2006.01)

(52) U.S. Cl. .................. 341/141; 341/172; 341/155; 348/245

(58) Field of Classification Search ............... 342/444; 73/771; 348/245; 38/7; 324/662; 341/155, 341/172, 141
See application file for complete search history.

(56) References Cited

U.S. PATENT DOCUMENTS

| | | |
|---|---|---|
| 3,619,511 A | 11/1971 | Ishikawa |
| 4,034,376 A | 7/1977 | Barton |
| 4,155,263 A | 5/1979 | Frantz |
| 4,455,754 A | 6/1984 | Benjamin |
| 4,734,775 A | 3/1988 | Blom |
| 4,860,354 A | 8/1989 | Van Roermund |
| 5,646,538 A | 7/1997 | Lide et al. |

*Primary Examiner*—Jean Bruner Jeanglaude
(74) *Attorney, Agent, or Firm*—Fliesler Meyer LLP

(57) ABSTRACT

The analog demultiplexer (FIG. 6) includes an input amplifier ($A_1$), and output amplifiers ($AMP_1$–$AMP_N$). The output and inverting (−) input of amplifiers ($AMP_1$–$AMP_N$) are connected by a respective capacitor ($C_1$–$C_N$). Switches ($S_{1a}$, $S_{1b}$, etc.) connect the output of amplifier ($A_1$) to the inverting input of one of ($AMP_1$–$AMP_N$). Switches ($S_{2a}$, $S_{2b}$, etc.) connect the output of one of ($AMP_1$–$AMP_N$) to the non-inverting input of the amplifier $A_1$. Switches ($S_{2a}$, $S_{2b}$, etc.) and ($S_{1a}$, $S_{1b}$, etc.) open and close together in pairs. With feedback from the output of ($AMP_1$–$AMP_N$) through ($A_1$), the gain and any offset of ($AMP_1$–$AMP_N$) is divided down by the gain of ($A_1$). Amplifier ($A_1$) has capacitors ($C_{S1}$ and $C_{S2}$) connected to its inputs. Switch ($S_{50}$) connects the inverting input of amplifier ($A_1$) to its output, and switch ($S_{40}$) connects the non-inverting input of ($A_1$) to a voltage reference ($V_{REF}$) matching ($V_{REF}$) applied to ($AMP_2$). Switches ($S_{30}$) and ($S_{35}$) connect ($C_{S1}$) and ($C_{S2}$) to the demultiplexer input (2). In operation, switches ($S_{40}$, $S_{50}$, $S_{30}$ and $S_{35}$) are initially closed, while switches ($S_{2a}$, $S_{2b}$, etc.) are open to charge both capacitors ($C_{S1}$) and ($C_{S2}$) and the inputs and output of ($A_1$) to ($V_{REF}$). Switch ($S_{50}$) provides feedback to divide down gain errors and offset of ($A_1$). Switches ($S_{30}$, $S_{35}$, $S_{40}$ and $S_{50}$) are then open, while one of switches ($S_{2a}$, $S_{2b}$, etc.) is closed with one switch ($S_{1a}$, $S_{1b}$, etc) to drive one of the output voltages ($V_{OUT1}$–$V_{OUTN}$). With inputs and outputs of ($A_1$) and the connected ($AMP_1$–$AMP_N$) initially be at ($V_{REF}$), very little settling time is needed.

20 Claims, 7 Drawing Sheets

US 7,002,498 B2

ANALOG DEMULTIPLEXING

CLAIM OF PRIORITY

This application is a continuation of U.S. patent application Ser. No. 10/236,340, filed Sep. 5, 2002 (now allowed) now U.S. Pat. No. 6,897,800, which claims priority under 35 U.S.C. § 119(e) to U.S. Provisional Patent Application No. 60/317,482, filed Sep. 5, 2001.

CROSS REFERENCE TO RELATED APPLICATIONS

This application is related to the following applications, each of which is incorporated herein by reference:

U.S. patent application Ser. No. 10/236,211, entitled "A Simplified Multi-Output Digital to Analog Converter (DAC) For a Flat Panel Display," filed on Sep. 5, 2002 (now U.S. Pat. No. 6,781,532).

U.S. patent application Ser. No. 10/896,275, entitled "A Simplified Multi-Output Digital to Analog Converter (DAC) For a Flat Panel Display," filed on Jul. 21, 2004 (now allowed).

BACKGROUND

1. Technical Field

The present invention relates to analog demultiplexer for distributing signals from a single input line to one of multiple output lines. In particular, the present invention relates to an analog demultiplexer for distributing a video input signal to one of several video display column drivers, with the analog demultiplexer having minimal offset due to its amplifiers, and having a minimal amplifier settling time.

2. Related Art

FIG. 1 shows one conventional configuration for an analog demultiplexer. The analog demultiplexer allows a multiplexed analog input voltage $V_{IN}$ received at input 2 to be demultiplexed using a switch $S_1$ to provide an output voltage $V_{OUT1}$–$V_{OUTN}$ at a respective one of outputs $4_1$–$4_N$. The logic control driving switch $S_1$ toggles switch $S_1$ to direct an input voltage $V_{IN}$ to one specific output buffer $AMP_1$–$AMP_N$. In this way, an input voltage provided at input $V_{IN}$ can be demultiplexed to one of numerous output buffers $AMP_1$–$AMP_N$.

Assuming the input voltage $V_{IN}$ at input 2 is to be sampled as output voltage $V_{OUT1}$ at output $4_1$, switch $S_1$ closes to connect amplifier $A_1$ to the capacitor $C_1$ and the input of amplifier $AMP_1$. The voltage at $V_{IN}$ is sampled onto capacitor $C_1$ and the buffered voltage appears on $V_{OUT1}$. Then the switch $S_1$ is opened. The hold capacitor $C_1$ retains the sampled voltage, and thus, the voltage at $V_{OUT1}$ remains constant for a period of time. In a similar manner, the input voltage $V_{IN}$ at input 2 can be connected using switch $S_1$ to sample and hold the input voltage $V_{IN}$ using another one of the capacitors $C_2$–$C_N$ and its corresponding amplifier $AMP_2$–$AMP_N$.

The undesirable effects of the analog demultiplexer of the configuration of FIG. 1 are as follows:

(1) The amplifiers $A_1$ and $AMP_1$–$AMP_N$ all create a voltage offset from the signal at $V_{IN}$;
(2) The amplifiers $A_1$ and $AMP_1$–$AMP_N$ are all shown with a gain of +1, but gain errors occur;
(3) A pedestal voltage offset error occurs when the switch $S_1$ opens; and
(4) The output amplifiers $AMP_1$–$AMP_N$ are NOT identical—Or the same input voltage at $V_{IN}$ generates a different output at each output $VOUT_1$–$VOUT_N$.

To improve the performance of analog demultiplexers, several approaches have been used. These approaches are described to follow.

$1^{st}$ Improvement

A first improvement over the analog demultiplexer of FIG. 1 is shown in FIG. 2. In operation, assuming the voltage $V_{IN}$ at input 2 is to be sampled as an output voltage $V_{OUT1}$ at output $4_1$, then switch $S_1$ closes and connects the output of amplifier $A_1$ to capacitor $C_1$ and the non-inverting input of amplifier $AMP_1$. At the same instant a second switch $S_2$ closes, connecting the output of amplifier $AMP_1$ to the inverting input of amplifier $A_1$. Note components carried over from FIG. 1 to FIG. 2 are similarly labeled, even though they are connected in a different manner, as will be components carried over into subsequent figures. The equivalent circuit for this switch state for FIG. 2 is shown in FIG. 3.

With feedback from output amplifier $AMP_1$ to $A_1$, the equivalent circuit is assumed to have a unity gain configuration. Assuming that the circuit is stable and the gain of both amplifier $A_1$ and amplifier $AMP_1$ are very large, any offset of $AMP_1$ is divided down by the gain of $A_1$. The voltage $V_{IN}$ plus the offset of amplifier $A_1$ is sampled onto the hold capacitor $C_1$. So, $$V_{OUT1} = V_{IN} + Vos(\text{offset of } A_1)$$

Advantages of the configuration of FIG. 2 are as follows:
(1) The voltage offset of $AMP_1$ is divided down by the gain of $A_1$; and
(2) The gain error or $AMP_1$ is divided down by the gain of $A_1$.

Undesirable effects of the configuration of FIG. 2 are as follows:
(1) The voltage offset of amplifier $A_1$;
(2) A voltage offset caused by charge injection of switch $S_2$ when it opens;
(3) The gain error of amplifier $A_1$; and
(4) A long settling time after switch $S_2$ closes.

Before switch $S_2$ of FIG. 2 closes, amplifier $A_1$ would be in an open loop configuration. Thus, its output will be in an undetermined voltage state. Amplifier $A_1$ is "saturated". Amplifier $A_1$ returns into its "active" region by glitching and ringing its output before it settles. (Settling time depends on the Bandwidth and Phase Margin of the cascaded amplifiers). When the output of amplifier $A_1$ rings, so does $V_{OUT1}$, an undesirable effect.

$2^{nd}$ Improvement

A second improvement over the analog demultiplexer of FIG. 1 is shown in FIG. 4. In the circuit of FIG. 4, a hold capacitor $C_1$, $C_2$, etc. is placed between the inverting input and output of each of the output amplifiers $AMP_1$, $AMP_2$, etc. Switches $S_1$ and $S_2$ operate as a pair to connect one of the output amplifiers $AMP_1$, $AMP_2$, . . . between the output of amplifier $A_1$ and its non-inverting input. A switch $S_3$ connects the output of $A_1$ to a reference voltage $V_{REF}$ when the switches $S_1$ and $S_2$ are not connected. The non-inverting input of the output amplifiers $AMP_1$, $AMP_2$, . . . are likewise connected to the reference $V_{REF}$.

In operation it is first assumed that $V_{IN}$ is to be sampled to $V_{OUT1}$. Switch $S_1$ then closes and connects the output of amplifier $A_1$ to capacitor $C_1$ and the inverting input of amplifier $AMP_1$. At the same instant, switch $S_2$ closes, connecting the output of amplifier $AMP_1$ to the non-inverting input of amplifier $A_1$. Switches $S_1$ and $S_3$ are non-overlapping, or are not connected at the same time. The equivalent circuit of such a connection is shown in FIG. 5.

With feedback, the circuit is in a unity gain configuration. If the gain of amplifier $A_1$ and $AMP_1$ are large, then $$V_{OUT1} \sim V_{IN} + Vos1 \text{ (offset of amplifier } A_1\text{).}$$

With amplifier $AMP_1$ in a feedback path, its inverting input (which is also the output of amplifier $A_1$) is approximately equal to $V_{REF}$. For this unity-gain configuration to settle fast, both sides of switch $S_1$ have to be approximately $V_{REF}$ before switch $S_1$ closes.

So, the output of the amplifier $A_1$ should be approximately at $V_{REF}$ before switch $S_1$ closes. This is done by clamping the output of $A_1$ to $V_{REF}$ by turning on switch $S_3$ (note: switch $S_1$ and $S_3$ are non-overlapping). This ensures that amplifier $A_1$ stays in the "active" region resulting in a faster settling time.

Advantages of the configuration of FIG. 4 are as follows:
(1) The voltage offset of $AMP_1$ is divided down by the gain of $A_1$, and is negligible.
(2) The settling time is reduced (Voltage at both sides of switch $S_1$ are approximately the same and amplifier $A_1$ is in its active region when switch $S_1$ closes).
(3) The gain error of $AMP_1$ is divided down by the gain of $A_1$.

Undesirable effects of the configuration of FIG. 4 are as follows:
(1) The voltage offset of amplifier $A_1$ remains;
(2) The gain error of amplifier $A_1$ remains; and
(3) Charge injection of switch $S_1$ to the output capacitor causing an offset error on the output.

SUMMARY

In accordance with an embodiment of the present invention, an analog demultiplexer is provided with the voltage offset and gain error of amplifiers $AMP_1$–$AMP_N$ and $A_1$ divided down to a minimal value. Further, the analog demultiplexer has a minimal settling time, and charge injection from switch $S_1$ to the output generates a minimal offset error.

The analog demultiplexer in accordance with an embodiment of the present invention (referring to FIG. 6) includes an input amplifier $A_1$, and a plurality of output amplifiers $AMP_1$–$AMP_N$, similar to FIG. 2. The output and inverting (−) input of amplifiers $AMP_1$–$AMP_N$ are connected by a respective capacitor $C_1$–$C_N$, as in FIG. 2. Also, similar to FIG. 2, a switch $S_1$ (in the case of FIG. 6 multiple switches $S_{1a}$, $S_{1b}$, etc.) serve to connect the output of amplifier $A_1$ to the inverting input of a respective one of amplifiers $AMP_1$–$AMP_N$. Similar to FIG. 2, a switch $S_2$ (in the case of FIG. 6 multiple switches $S_{2a}$, $S_{2b}$, etc.) serve to connect the output of one of amplifiers $AMP_1$–$AMP_N$ to the non-inverting input of the amplifier $A_1$. As in FIG. 2, switches $S_{2a}$, $S_{2b}$, etc. can function to switch together with respective ones of switches $S_{1a}$, $S_{1b}$, etc. As in FIG. 2, with feedback from the output of amplifiers $AMP_1$–$AMP_N$ through $A_1$, the gain as well as the offset of any of $AMP_1$–$AMP_N$ is divided down by the gain of $A_1$.

Unlike the circuit of FIG. 2, in an embodiment, the amplifier $A_1$ has a capacitor $C_{S1}$ connected to its non-inverting input and another capacitor $C_{S2}$ connected to its inverting input. A switch $S_{50}$ connects the inverting input of amplifier $A_1$ to its output, and a switch $S_{40}$ connects the non-inverting input of amplifier $A_1$ to a voltage reference $V_{REF}$ matching a voltage reference $V_{REF}$ applied to the non-inverting input of amplifier $AMP_2$. A switch $S_{30}$ connects the capacitor $C_{S1}$ to receive the demultiplexer input 2, while a switch $S_{35}$ connects the capacitor $C_{S2}$ to the demultiplexer input 2. In operation, switches $S_{40}$, $S_{50}$, $S_{30}$ and $S_{35}$ are initially closed, while switches $S_{2a}$, $S_{2b}$, etc. are open to charge up both capacitors $C_{S1}$ and $C_{S2}$ to $V_{REF}$ to assure both inputs of amplifier $A_1$ and its output are at $V_{REF}$. Switch $S_{50}$ provides feedback to assure gain errors and offset of $A_1$ are divided down. Switches $S_{30}$, $S_{35}$, $S_{40}$ and $S_{50}$ are then open, while one of switches $S_{2a}$, $S_{2b}$, etc. is closed in correspondence with a switch $S_{1a}$, $S_{1b}$, etc. Since the inputs and output of both $A_1$ and the corresponding amplifier $AMP_1$–$AMP_N$ will initially be at $V_{REF}$, very little settling time will be required to stabilize the respective output voltage $V_{OUT1}$–$V_{OUTN}$.

To improve switching speed in one embodiment, the switches $S_{1a}$, $S_{1b}$, etc. are preferably formed from as a CMOS switch made from a combined PMOS and NMOS transmission gate. The NMOS transistor enables the circuit to switch fast, while the PMOS transistor being on after the circuit settles removes voltage offset typically existing with only an NMOS transistor. Using a CMOS switch, in one embodiment a dummy switch can be added in series with the CMOS switch which is half the size to cancel any charge offset produced by the active switch. In another embodiment, the gate size of transistors for switches $S_{1a}$, $S_{1b}$ etc. are reduced to limit any offset due to these switches.

BRIEF DESCRIPTION OF THE DRAWINGS

Further details of the present invention are explained with the help of the attached drawings in which.

DETAILED DESCRIPTION

Figure 1:
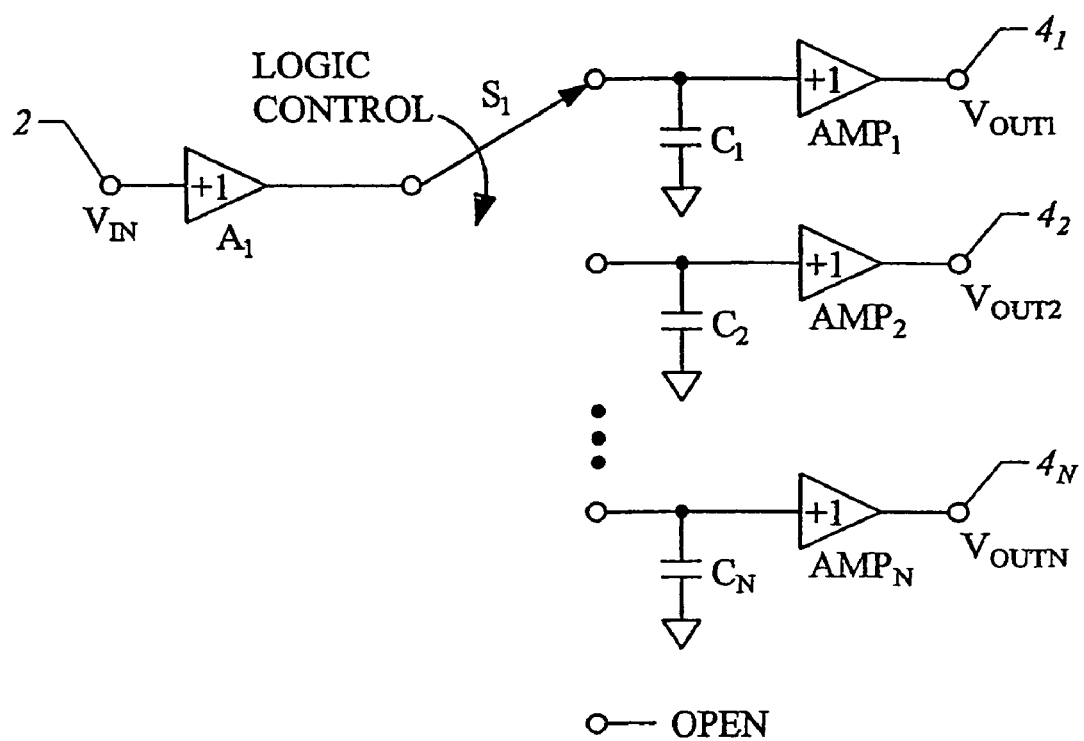
FIG. 1 shows one conventional configuration for an analog demultiplexer.
Figure 2:
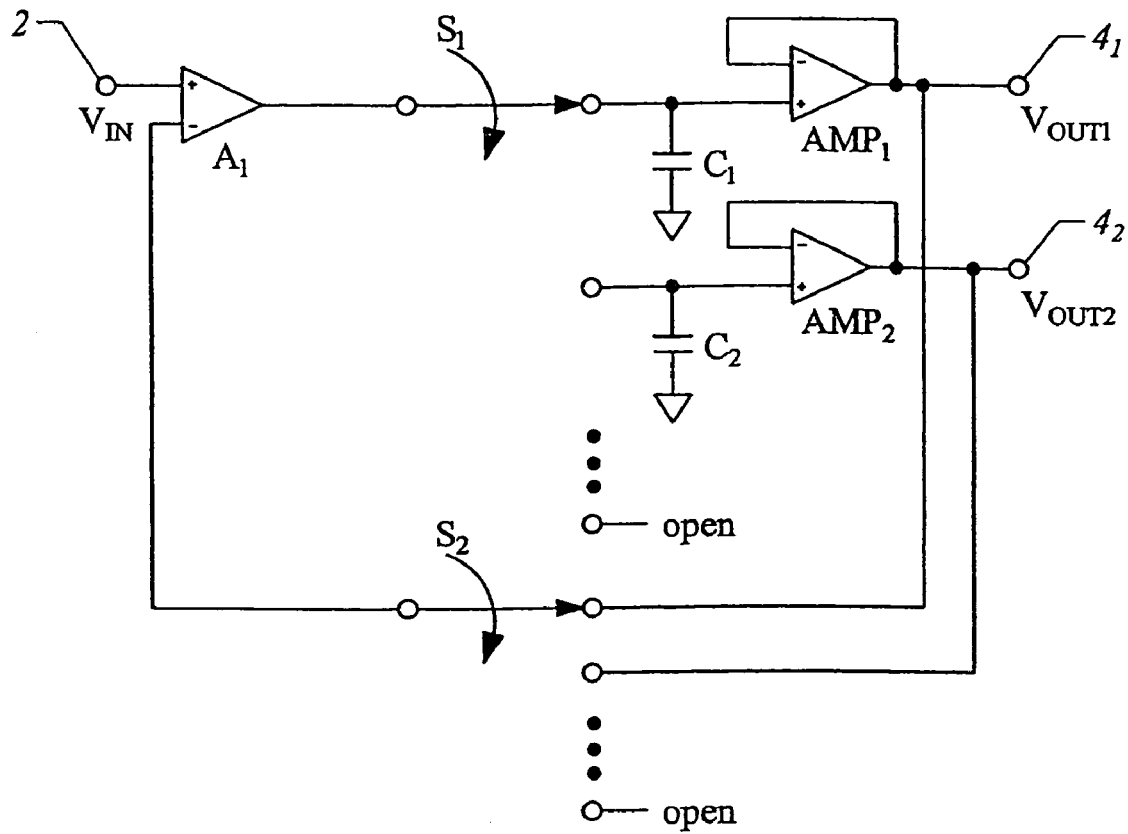
FIG. 2 shows a first improvement over the analog demultiplexer of FIG. 1.
Figure 3:
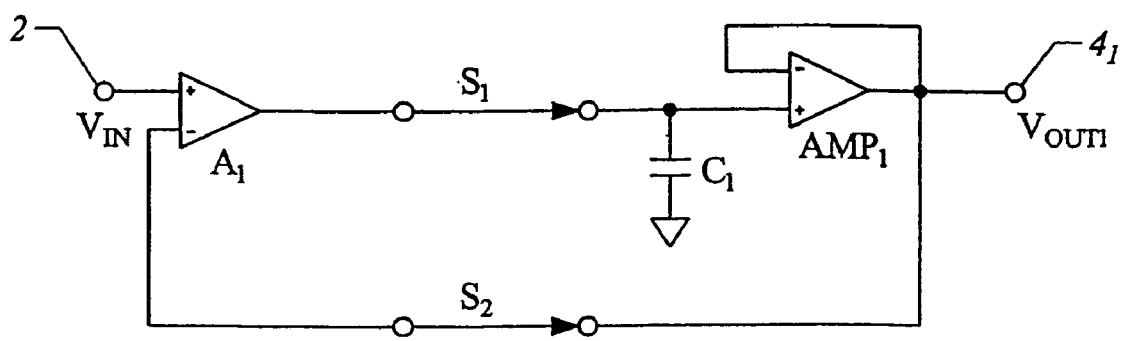
FIG. 3 shows an equivalent circuit for the switch state of FIG. 2.
Figure 4:
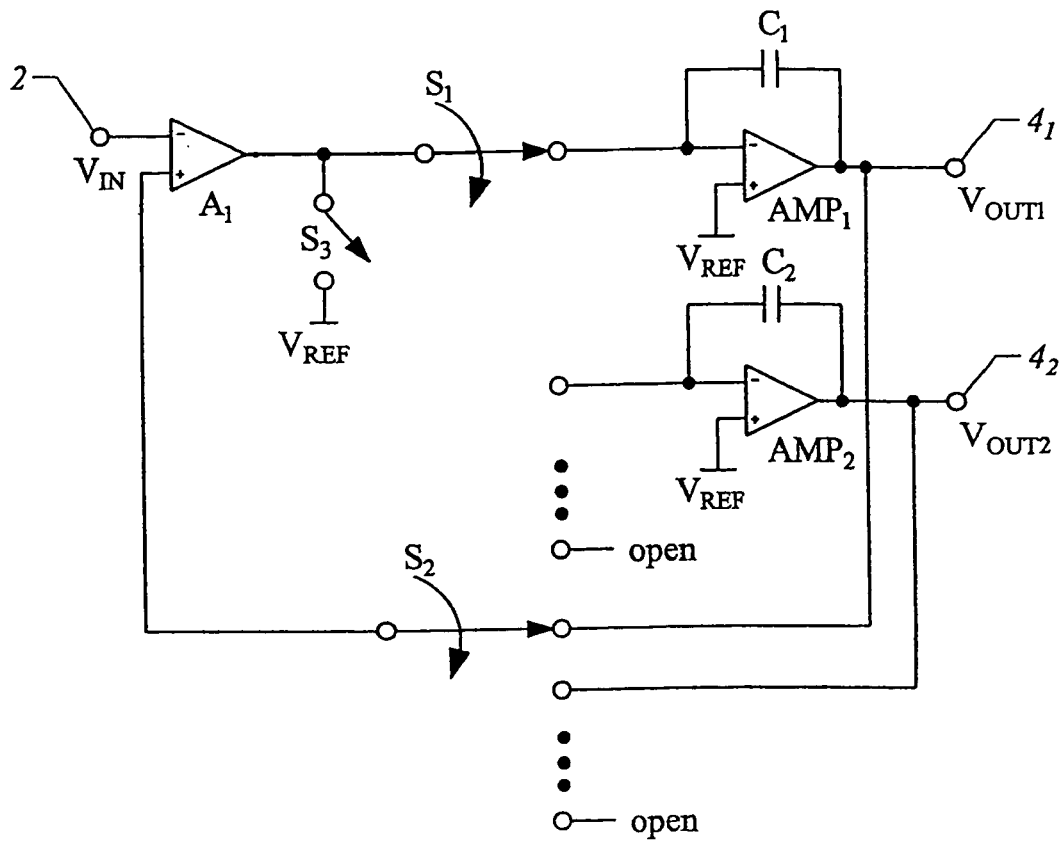
FIG. 4 shows a second improvement over the analog demultiplexer of FIG. 1.
Figure 5:
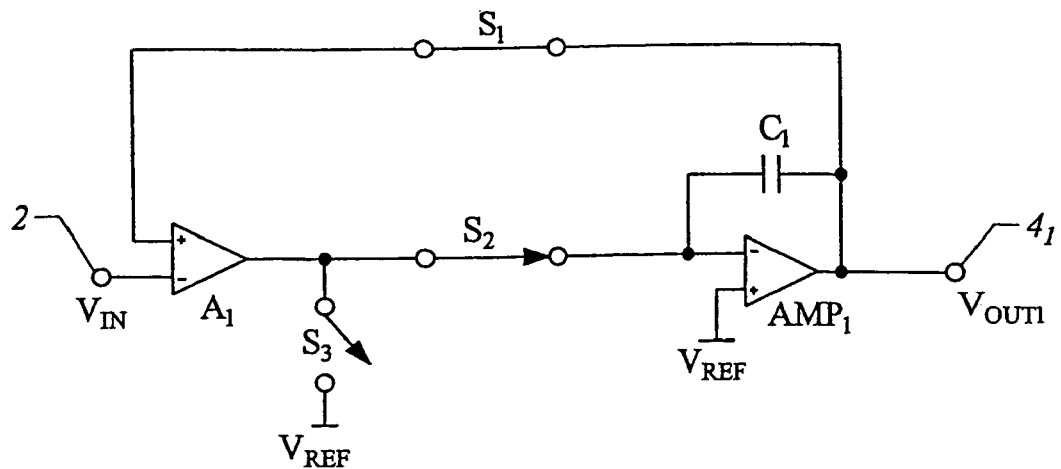
FIG. 5 shows an equivalent circuit for the switch state of FIG. 4.
Figure 6:
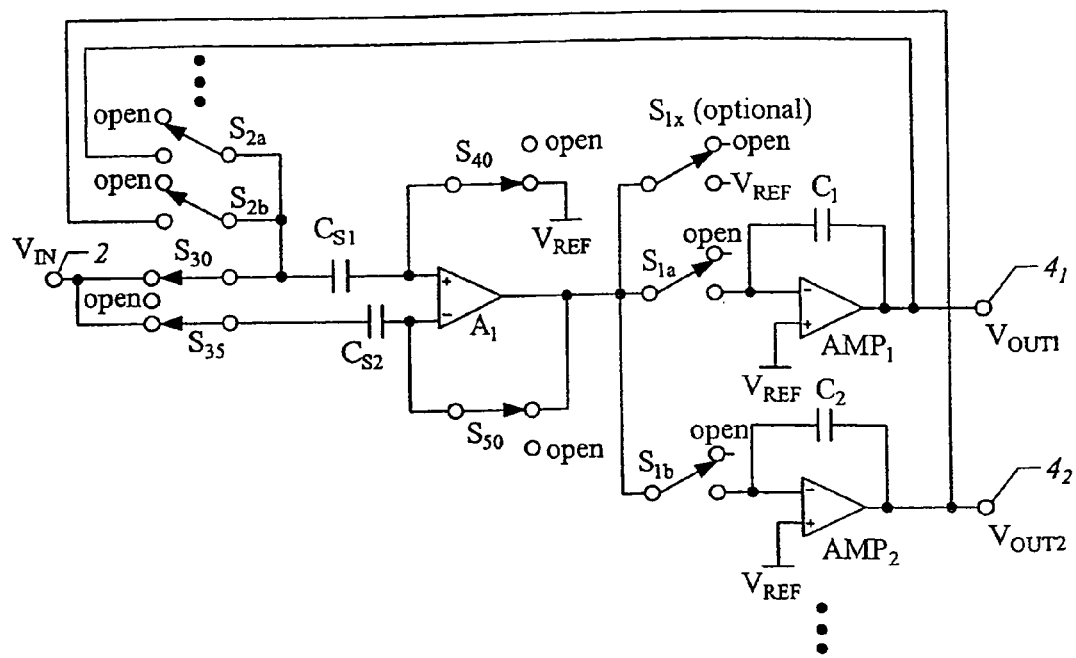
FIG. 6 shows an analog demultiplexer in accordance with the present invention.

An approach for an analog demultiplexer in accordance with the present invention is shown in FIG. 6. Using this circuit and switching $S_{1a}, S_{1b}$ ... etc. and $S_{2a}, S_{2b}$ ... etc., control logic can guide $V_{IN}$ to be sampled and held on a specific one of the output buffers $AMP_1$–$AMP_N$. Note that FIG. 6 shows use of multiple switches $S_{1a}, S_{1b}$ ... etc. and $S_{2a}, S_{2b}$ ... etc., as an alternative, a single switch could be used for all of switches $S_{1a}, S_{1b}$ ... etc. or $S_{2a}, S_{2b}$ ... etc. However, use of multiple switches permits the input amplifier $A_1$ to be connected to more than one of the output amplifiers $AMP_1$–$AMP_N$ at one time. Further note that although switches such as $S_{1a}$ and $S_{2a}$ typically open and close together simultaneously in prior art designs, in the present invention the switches may or may not close simultaneously.

Figure 7:
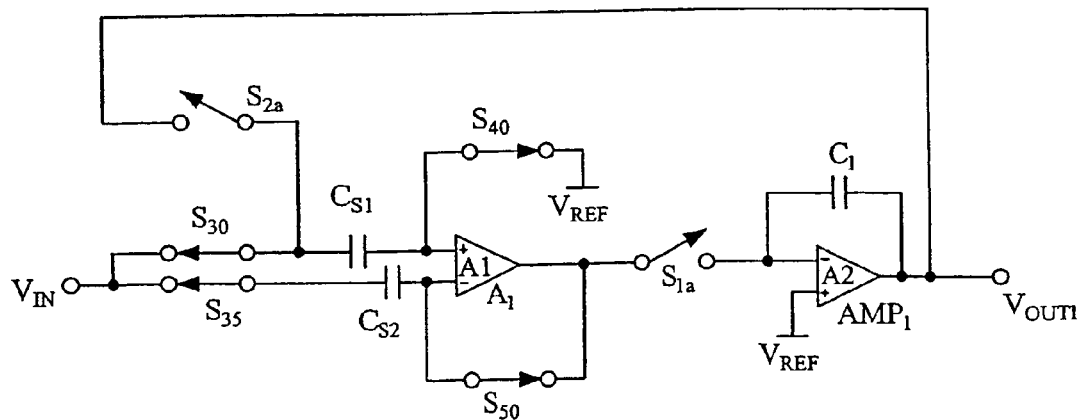
FIG. 7 shows the analog demultiplexer of FIG. 7 with connections only between the input amplifier $A_1$ and output amplifier $AMP_1$.

For a description of operation, to simplify the system of FIG. 6, FIG. 7 is included showing only two amplifiers, assuming $V_{IN}$ is to be sampled to an output amplifier $AMP_1$. Further, it is initially assumed that the gain of amplifier $A_1=A_1$ and the gain of amplifier $AMP_1=A_2$. The connection of switches in FIG. 7 enable the value $V_{REF}$ to be maintained at the inputs and output of amplifiers $A_1$ and $AMP_1$–$AMP_N$ prior to connection of the amplifier $A_1$ to one of amplifiers $AMP_1$–$AMP_N$ is described to follow with equivalent circuits shown for each stage.

$1^{st}$ Stage

Figure 8:
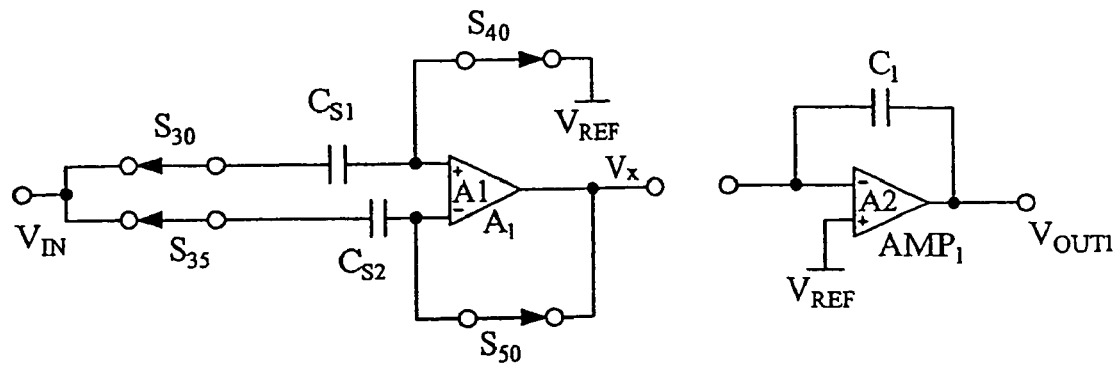
FIG. 8 shows an equivalent circuit for the switch state of FIG. 7.

First, switches $S_{40}, S_{50}, S_{30}$ and $S_{35}$ are closed, making the circuit portion shown in FIG. 7 appear as shown in the equivalent circuit of FIG. 8. Amplifier $A_1$ is in a unity-gain configuration. Amplifier $AMP_1$ is in the "hold" state, keeping the previously set $V_{OUT1}$ constant. Thus, the following applies.

$$Vx = A1(V_+ + V_{OS1} - V_-)$$
$$= A1(V_{REF} + V_{OS1} - Vx)$$
$$Vx(1+A1) = A1(V_{REF} + V_{OS1})$$
$$Vx = [A1/(1+A1)](Vref + V_{OS1})$$

Voltage across capacitor $C_{S1} = V_{CS1}$
$$= V_{IN} - V_{REF}$$

Voltage across capacitor $C_{S2} = V_{CS2}$
$$= V_{IN} - V_X$$
$$= V_{IN} - [A1/(1+A1)](V_{REF} + V_{OS1}).$$

$2^{nd}$ Stage

Figure 9:
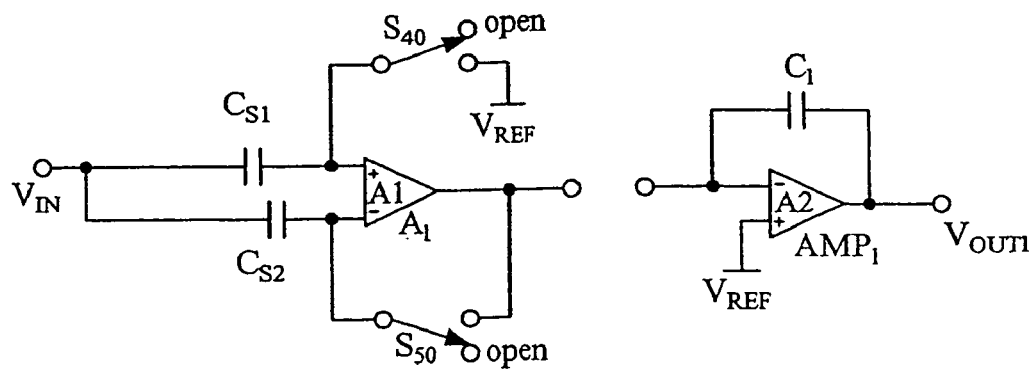
FIG. 9 shows the equivalent circuit for FIG. 7 with switches $S_{40}$ and $S_{50}$ changing to an open state.

Next, switches $S_{40}$ and $S_{50}$ are opened creating a circuit as shown in FIG. 9. When switches $S_{40}$ and $S_{50}$ are opened, there is charge injected into capacitors $C_{S1}$ and $C_{S2}$. The offset would be common mode if $S_{40}/C_{S1} \sim S_{50}/C_{S2}$. Assuming the size of switches $S_{40}=S_{50}$ and $C_{S1}=C_{S2}$, the offset to both capacitors caused by charge injection would be the same.

$3^{rd}$ Stage

Figure 10:
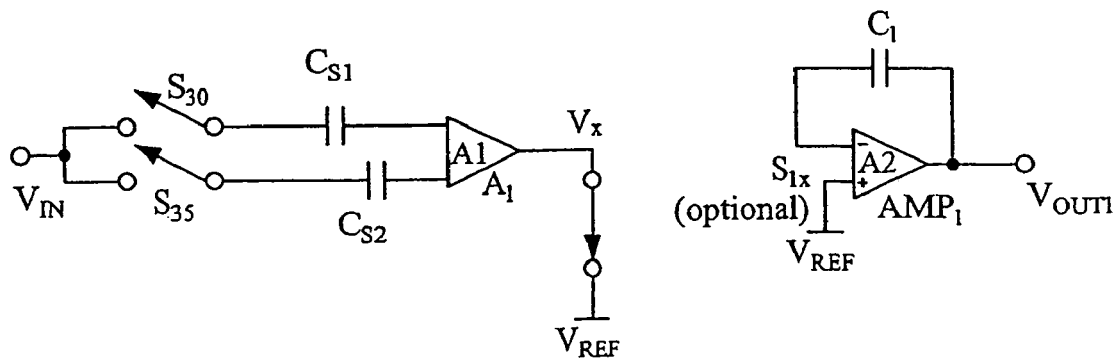
FIG. 10 shows the equivalent circuit for FIG. 7 with the $S_{40}$ and $S_{50}$ of FIG. 9 remaining open and additionally switches $S_{30}$ and $S_{35}$ opening.

Next, in addition to the switches open in FIG. 9, switches $S_{30}$ and $S_{35}$ are opened creating a circuit as shown in FIG. 10. As a further option in this state, switch $S_{1x}$ can be closed, connecting $V_X$ to $V_{REF}$, so $V_X$ is clamped to $V_{REF}$. Switch $S_{1x}$ is then opened before stage 4.

$4^{th}$ Stage

Figure 11:
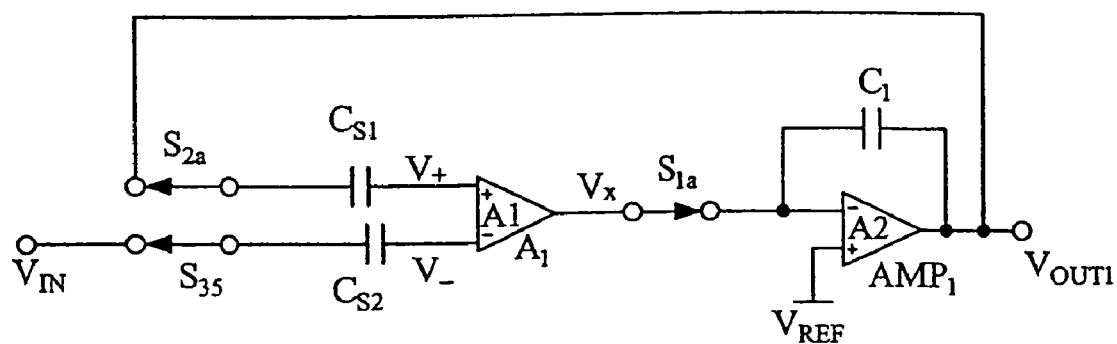
FIG. 11 shows an equivalent circuit for FIG. 7 with the switches $S_{30}$, $S_{40}$, $S_{50}$ remaining open, but switches $S_{2a}$ and $S_{1a}$ closing.

Next, switches $S_{1a}, S_{2a}$ and $S_{35}$ are closed creating a circuit as shown in FIG. 11. As configured in FIG. 11, the equations of Appendix I of this application apply.

$5^{th}$ Stage

Figure 12:
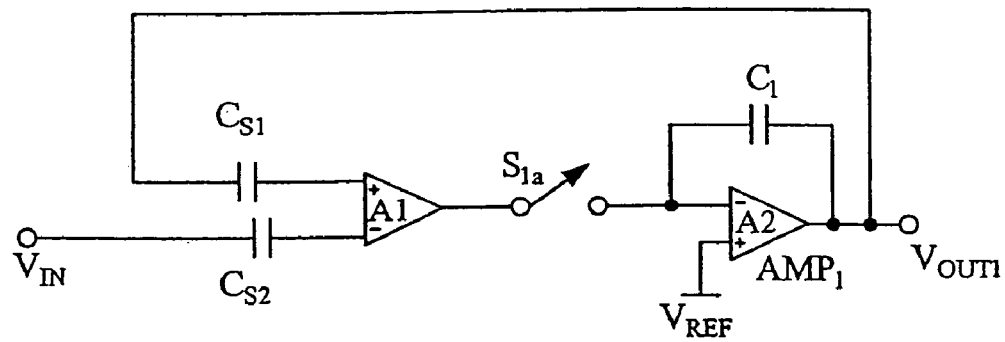
FIG. 12 shows an equivalent circuit with switches $S_{30}$, $S_{40}$, $S_{50}$ remaining open, and switch $S_{2a}$ remaining closed, but $S_{1a}$ reopening.

Next, switch $S_{1a}$ is reopened as shown in FIG. 12, as the amplifier $AMP_1$ has sampled and will hold the value $V_{IN}$ at the output $V_{OUT1}$.

$6^{th}$ Stage

Next, or in conjunction with switch $S_{1a}$, switch $S_{2a}$ is reopened, to prepare for a subsequent sampling since $V_{IN}$ has been sampled and held by output amplifier $AMP_1$. The control logic can now start to sample $V_{IN}$ to a different amplifier (for example $AMP_2$). With sampling to $AMP_2$, all the stages explained herein are then performed again, but with $AMP_2$ replacing $AMP_1$. After $V_{IN}$ is sampled to $AMP_2$, the control logic samples $V_{IN}$ to another amplifier and so on. To overcome voltage droop, the output amplifiers $AMP_1$–$AMP_N$ are refreshed repetitively by a subsequent sampling of $V_{IN}$.

The advantages of the configuration in accordance with the present invention are as follows:

(1) The offset for both amplifier $A_1$ and $AMP_1$ are reduced by the gain of $A_1$;
(2) The circuit settles fast because both sides of switch $S_{1a}$ are almost at the same potential before switch $S_{1a}$ closes; and
(3) CMRR and gain error for both amplifiers are corrected.

To improve the charge injection in switch $S_{1a}$, the following additional steps can be performed:

(1) Use a small switch; and
(2) Use charge injection cancellation techniques like:
    in CMOS, use PMOS and NMOS transmission gates; and
    use a dummy switch.

Use of small switch, simply implies use of one or more transistors making up the switch with a small gate size. The smaller gate size reduces charge buildup, and thus charge injection when the switch opens or closes. Typically, a high voltage transmission gate is large in dimension to withstand the higher voltage applied on it. Due to the large gate size, a large charge will be lying underneath the gate when it is in its "on" state. When the switch opens, the charge will inject into the hold capacitor creating an offset seen on the output amplifier. The voltage driving the transmission gate switches will be between a high voltage and ground. The large voltage swing on the transmission gate feeds through to the hold capacitor through the overlap capacitance of the large switch, providing another source offset.

Use of CMOS designs enables reduction in charge injection since it uses PMOS transistors causing less charge buildup. The CMOS design still includes an NMOS transistor to which turns on initially much faster than the PMOS transistor. In CMOS high voltage designs, charge injection will still produce an offset in the hold capacitors of the output amplifiers. The offset is caused by the charge under the gate injecting into the hold capacitor when the switch opens. The amount of offset is determined by: (1) the control voltage swing of the switch; and (2) the size of the switch.

Figure 13:
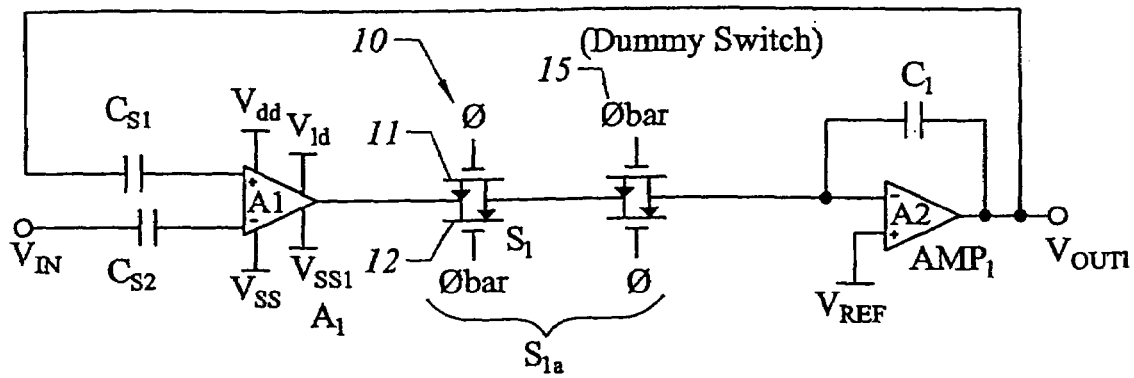
FIG. 13 shows transistors used to create a switch $S_{1a}$, and voltages applied to reduce any offset due to charge injection.

A low voltage CMOS switch 10 used for switch $S_{1a}$ includes PMOS and NMOS transistors 11 and 12 as shown in FIG. 13. The source-drain path of the NMOS transistor 11 and PMOS transistor 12 are connected in parallel between the output of amplifier $A_1$ and an input of amplifier $AMP_1$. The gates of transistors 11 and 12 receive complementary control signals $\phi$ and $\phi$bar.

To avoid offset, particular control voltages as well as use of a dummy switch may be employed as further illustrated in FIG. 13. In the approach of FIG. 13, two supply voltages are used for amplifier $A_1$. (Vdd=High voltage; V1d=low voltage). The output of amplifier $A_1$ is prevented from going above V1d (output of amplifier A1 can swing between Vss1 and V1d; Note: Vss1 and Vss could be tied together). The dummy switch 15 has transmission gates half the size of the transmission gates of transistors 11 and 12 forming the low voltage switch 10. The transmission gates of the dummy switch 10 are driven by a signal $\phi$ and $\phi$bar, similar to switch 10. Signals $\phi$ and $\phi$bar swing between voltages of V1d and Vss1. The output of amplifier $A_1$ is prevented from going above V1d so that a low voltage switch 10 and dummy switch 15 can be used for switch $S_{1a}$.

By using a low voltage switch (small gate area—small charge under the gate), the offsets caused by charge injection and clock feed through can be further minimized. The dummy switch 15 that is half the size of switch 10 is used to cancel the charge produced by switch 10.

Another improvement is having the value of $V_{REF}$ between V1d and Vss. When the circuit settles in the unity gain configuration, the output of amplifier $A_1$ would be at $V_{REF}$. The chosen $V_{REF}$ voltage is dependent on the size of the PMOS and NMOS transistors in switch $S_{1a}$. If the PMOS and NMOS transistors in switch $S_{1a}$ are the same size, the charge in both the transistors (holes recombining with the electrons) would cancel each other out if:

$$V_{REF}=(V1d+Vss)/2. \qquad (1)$$

Figure 14:
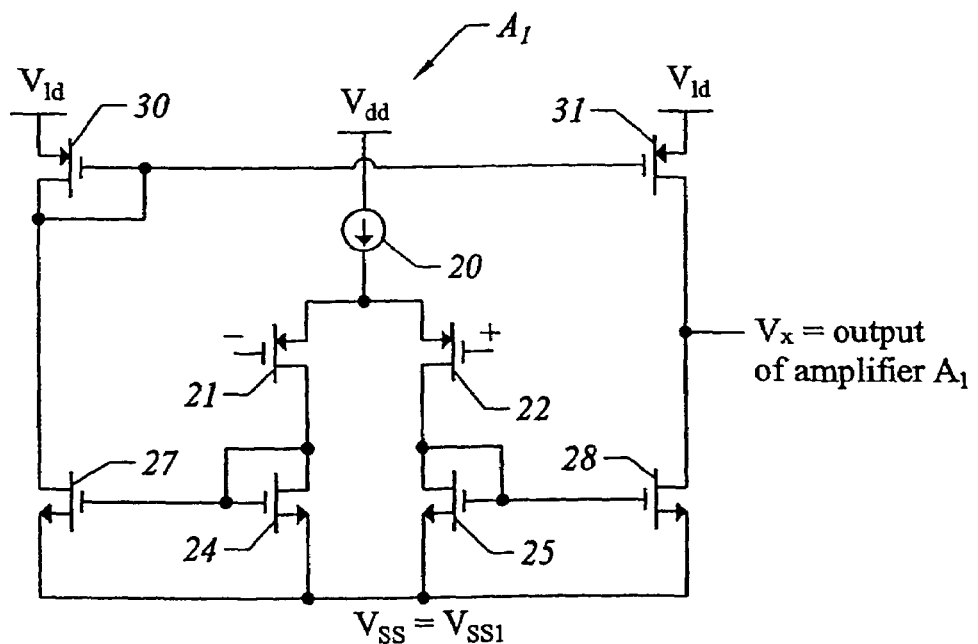
FIG. 14 shows components for an embodiment of the input amplifier $A_1$.

An example of a circuit implementation of amplifier $A_1$ is shown in FIG. 14. Amplifier $A_1$ includes two PMOS transistors 21 and 22 connected in a differential fashion. Transistor 21 has a gate forming the inverting (−) input of amplifier $A_1$, while the gate of transistor 22 forms the non-inverting (+) input of amplifier $A_1$. The sources of transistors 21 and 22 are fed from a current sink 20 connected to Vdd. Drains of transistors 21 and 22 are connected through respective NMOS transistors 24 and 25 to Vss. Note Vss and Vss1 are the same voltage. Transistors 24 and 25 are then connected in a current mirror configuration with respective NMOS transistors 27 and 28. Transistor 27 has a source-drain path connected in series with transistor 30 between V1d and Vss1, while transistor 28 has a source-drain path connected in series with transistor 31 between V1d and Vss1. The connection between the source-drain paths of transistors 28 and 31 form the output of the amplifier $A_1$.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A method for demultiplexing an input signal ($V_{IN}$) using an input amplifier ($A_1$) and a plurality of output amplifiers ($AMP_1$–$AMP_N$), the input amplifier ($A_1$) having first and second inputs and an output, the output amplifiers ($AMP_1$–$AMP_N$) each having first and second inputs and an output, the method comprising the steps of:

providing a first input capacitor ($C_{S1}$) having a first terminal, and having a second terminal connected to the first input of the input amplifier ($A_1$);

providing a second input capacitor ($C_{S2}$) having a first terminal, and having a second terminal connected to the second input of the input amplifier ($A_1$);

accepting the input signal ($V_{IN}$) at an input terminal (2);

selectively connecting the input terminal (2) to the first terminal of the first input capacitor ($C_{S1}$);

selectively connecting the input terminal (2) to the first terminal of the second input capacitor ($C_{S2}$);

selectively connecting the output of the input amplifier ($A_1$) to the first input of one of the output amplifiers ($AMP_1$–$AMP_N$); and selectively connecting the output of one of the output amplifiers ($AMP_1$–$AMP_N$) to the first terminal of the first input capacitor ($C_{S1}$).

2. The method of claim 1, further comprising providing feedback capacitors ($C_1$–$C_N$), each feedback capacitor connecting the first input of one of the output amplifiers ($AMP_1$–$AMP_N$) to its output.

3. The method of claim 1, wherein the selective connecting is performed such tat when the first input of one of the output amplifiers ($AMP_1$–$AMP_N$) is initially connected to the output of the input amplifier ($A_1$), the output of said one of the output amplifiers ($AMP_1$–$AMP_N$) is simultaneously connected the first terminal of the first input capacitor ($C_{S1}$).

4. The method of claim 1, further comprising selectively connecting the second input of the input amplifier ($A_1$) to the output of the input amplifier ($A_1$).

5. The method of claim 4, further comprising selectively connecting the first input of the input amplifier ($A_1$) to a reference voltage ($V_{REF}$).

6. The method of claim 5, wherein the selective connecting is performed such that at the same time:

the first input of the input amplifier ($A_1$) is connected to the reference voltage ($V_{REF}$), the second input of the input amplifier ($A_1$) is connected to the output of the input amplifier ($A_1$), the input terminal (2) is connected to the first terminal of the first input capacitor ($C_{S1}$), and the input terminal (2) is connected to the first terminal of the second input capacitor ($C_{S2}$).

7. The method of claim 6, wherein the selective connecting is performed such tat the output of none of the output amplifiers ($AMP_1$–$AMP_N$) is connected to the first terminal of to first input capacitor ($C_{S1}$) when:

the first input of the input amplifier ($A_1$) is connected to the output of the input amplifier ($A_1$), the first input of the input amplifier ($A_1$) is connected to the reference voltage ($V_{REF}$), the input terminal (2) is connected to the first terminal of the first input capacitor ($C_{S1}$), and the input terminal (2) is connected to the first terminal of the second input capacitor ($C_{S2}$).

8. The method of claim 1, further comprising providing a reference voltage ($V_{REF}$) to the second input of each of the output amplifiers ($AMP_1$–$AMP_N$).

9. The method of claim 8, further comprising connecting the output of the input amplifier ($A_1$) to the reference voltage ($V_{REF}$) when the output of the input amplifier ($A_1$) is not connected to the first input of any of the output amplifiers ($AMP_1$–$AMP_N$).

10. A method for demultiplexing an input signal ($V_{IN}$) using an input amplifier ($A_1$) and a plurality of output amplifiers ($AMP_1$–$AMP_N$); the input amplifier ($A_1$) having an inverting (−) input, a non-inverting (+) input and an output, the output amplifiers ($AMP_1$–$AMP_N$) each having an inverting (−) input, a non-inverting (+) input and an output, the method comprising the steps of:

providing a first input capacitor ($C_{S1}$) having a first terminal, and having a second terminal connected to the non-inverting (+) input of the input amplifier ($A_1$);

providing a second input capacitor ($C_{S2}$) having a first terminal, and having a second terminal connected to the inverting (−) input of the input amplifier ($A_1$);

accepting the input signal ($V_{IN}$) at an input terminal (2);

selectively connecting the input terminal (2) to the first terminal of the first input capacitor ($C_{S1}$);

selectively connecting the input terminal (2) to the first terminal of the second input capacitor ($C_{S2}$);

selectively connecting the output of the input amplifier ($A_1$) to the inverting (−) input of one of the output amplifiers ($AMP_1$–$AMP_N$); and selectively connecting the inverting (−) input of the input amplifier ($A_1$) to the output of the input amplifier ($A_1$).

11. The method of claim 10, further comprising providing feedback capacitors ($C_1$–$C_N$), each feedback capacitor connecting the inverting (−) input of one of the output amplifiers ($AMP_1$–$AMP_N$) to its output.

12. The method of claim 10, further comprising selectively connecting the output of one of the output amplifiers ($AMP_1$–$AMP_N$) to the first terminal of the first input capacitor ($C_{S1}$).

13. The method of claim 12, wherein the selective connecting is performed such that when the inverting (−) input of one of the output amplifiers ($AMP_1$–$AMP_N$) is initially connected to the output of the input amplifier ($A_1$), the output of said one of the output amplifiers ($AMP_1$–$AMP_N$) is simultaneously connected the first terminal of the first input capacitor ($C_{S1}$).

14. The method of claim 10, further comprising selectively connecting the non-inverting (+) input of the input amplifier ($A_1$) to a reference voltage ($V_{REF}$).

15. The method of claim 14, wherein the selective connecting is performed such that at the same time:

the non-inverting (+) input of the input amplifier ($A_1$) is connected to the reference voltage ($V_{REF}$), the inverting (−) input of the input amplifier ($A_1$) is connected to the output of the input amplifier ($A_1$), the input terminal (2) is connected to the first terminal of the first input capacitor ($C_{S1}$), and the input terminal (2) is connected to the first terminal of the second input capacitor ($C_{S2}$).

16. The method of claim 15, wherein the selective connecting is performed such that no output of the output amplifiers ($AMP_1$–$AMP_N$) is connected to the first terminal of the first input capacitor ($C_{S1}$) when the non-inverting (+) input of the input amplifier ($A_1$) is connected to the reference voltage ($V_{REF}$), the inverting (−) input of the input amplifier ($A_1$) is connected to the output of the input amplifier ($A_1$), the input terminal (2) is connected to the first terminal of the first input capacitor ($C_{S1}$), and the input terminal (2) is connected to the first terminal of the second input capacitor ($C_{S2}$).

17. The method of claim 10, further comprising providing a reference voltage ($V_{REF}$) to the non-inverting input (+) of each of the output amplifiers ($AMP_1$–$AMP_N$).

18. The method of claim 10, further comprising connecting the output of the input amplifier ($A_1$) to the reference voltage ($V_{REF}$) when the output of the input amplifier ($A_1$) is not connected to the inverting input (−) of any of the output amplifiers ($AMP_1$–$AMP_N$).

19. A method for demultiplexing an input signal ($V_{IN}$) using an input amplifier ($A_1$) and a plurality of output amplifiers ($AMP_1$–$AMP_{IN}$), the input amplifier ($A_1$) having first and second inputs and an output, the output amplifiers ($AMP_1$–$AMP_N$) each having first and second inputs and an output, the method comprising the steps of:

providing a first input capacitor ($C_{S1}$) having a first terminal, and having a second terminal connected to the first input of the input amplifier ($A_1$);

providing a second input capacitor ($C_{S2}$) having a first terminal, and having a second terminal connected to the second input of the input amplifier ($A_1$);

accepting the input signal ($V_{IN}$) at an input terminal (2); and simultaneously connecting the input terminal (2) to the first terminal of the second input capacitor ($C_{S2}$), the output of the input amplifier ($A_1$) to the first input of one of the output amplifiers ($AMP_1$–$AMP_N$), and the output of said one of the output amplifiers ($AMP_1$–$AMP_N$) to the first terminal of the first input capacitor ($C_{S1}$).

20. The method of claim 19, wherein prior to said simultaneously connecting, causing the first and second inputs and the output of the input amplifier ($A_1$) to be at or close to a reference voltage level $V_{REF}$ that is applied to the second input of each of the output amplifiers ($AMP_1$–$AMP_N$).

* * * * *